(12) United States Patent
Chow et al.

(10) Patent No.: US 9,059,674 B2
(45) Date of Patent: Jun. 16, 2015

(54) MULTI-TUNABLE SUPERCONDUCTING CIRCUITS

(75) Inventors: Jerry M. Chow, White Plains, NY (US); Antonio D. Corcoles Gonzalez, Mount Kisco, NY (US); Jay M. Gambetta, Yorktown Heights, NY (US); Matthias Steffen, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 377 days.

(21) Appl. No.: 13/566,127

(22) Filed: Aug. 3, 2012

(65) Prior Publication Data

US 2014/0235450 A1 Aug. 21, 2014

Related U.S. Application Data

(63) Continuation of application No. 13/561,324, filed on Jul. 30, 2012.

(51) Int. Cl.

| | |
|---|---|
| *H01L 39/22* | (2006.01) |
| *H03K 19/195* | (2006.01) |
| *H03H 7/01* | (2006.01) |
| *G06N 99/00* | (2010.01) |
| *H01P 3/08* | (2006.01) |
| *H01P 7/00* | (2006.01) |
| *H01L 39/00* | (2006.01) |
| *H01P 1/203* | (2006.01) |
| *G01R 23/02* | (2006.01) |

(52) U.S. Cl.
CPC ........... *H03H 7/0115* (2013.01); *G06N 99/002* (2013.01); *G01R 23/02* (2013.01); *H01P 3/082* (2013.01); *H03H 7/0138* (2013.01); *H03H 7/0153* (2013.01); *H01P 7/00* (2013.01); *H01L 39/00* (2013.01); *H01P 1/20381* (2013.01)

(58) Field of Classification Search
None
See application file for complete search history.

(56) References Cited

U.S. PATENT DOCUMENTS

| | | | |
|---|---|---|---|
| 7,253,654 B2 | 8/2007 | Amin | |
| 7,268,576 B2 | 9/2007 | Amin | |
| 7,533,068 B2 | 5/2009 | Maassen van den Brink et al. | |
| 7,605,600 B2 | 10/2009 | Harris | |
| 7,800,395 B2 | 9/2010 | Johnson et al. | |
| 8,102,185 B2 | 1/2012 | Johansson et al. | |
| 8,111,083 B1 * | 2/2012 | Pesetski et al. | 326/3 |
| 2011/0057169 A1 | 3/2011 | Harris et al. | |
| 2012/0187378 A1 | 7/2012 | Bonderson et al. | |

OTHER PUBLICATIONS

R. C. Bialczak et al., • Fast Tunable Coupler for Superconducting Qubits,• Phys. Rev. Lett., vol. 106, 2011, 060501, 4 pages.
(Continued)

*Primary Examiner* — Jany Richardson
(74) *Attorney, Agent, or Firm* — Cantor Colburn LLP; Vazken Alexanian

(57) ABSTRACT

A method of characterizing a tunable superconducting circuit, includes selecting an operating direct current (DC) flux for a first charge island from a plurality of coupled charge islands residing in the tunable superconducting circuit coupled to a first resonator and a second resonator, tuning operating DC flux values for at least two charge islands from the plurality of coupled charge islands, measuring coupling energies of the first resonator and the second resonator and measuring frequencies from each of the plurality of coupled charge islands.

19 Claims, 5 Drawing Sheets

(56) References Cited

OTHER PUBLICATIONS

J. M. Gambetta et al., "Superconducting Qubit with Purcell Protection and Tunable Coupling," Phys. Rev. Lett., vol. 106, 2011, 030502, 4 pages.

R. Harris et al., "Sign- and Magnitude-Tunable Coupler for Superconducting Flux Qubits," Phys. Rev. Lett., vol. 98, 2007, 177001, 4 pages.

R. A. Pinto et al., "Analysis of a tunable coupler for superconducting phase qubits", Phys. Rev. B, vol. 82, 2010, 104522, 11 pages.

D. I. Tsomokos et al., "Using superconducting qubit circuits to engineer exotic lattice systems," Phys. Rev. A, vol. 82, 2010, 052311, 6 pages.

A.O. Niskanen, et al., "Quantum Coherent Tunable Coupling of Superconducting Qubits," Science, vol. 316, May 4, 2007, pp. 723-726.

David P. DiVincenzo, "Fault tolerant architectures for superconducting qubits", Phys. Scr. T137, 014020, 2009, pp. 1-10.

J. Majer, et al., "Coupling Superconducting Qubits via a Cavity Bus," Nature, 449, Sep. 2007, pp. 1-6.

M.S. Allman, et al., "RFSQUID-Mediated Coherent Tunable Coupling Between a Superconducting Phase Qubit and a Lumped Element Resonator," Physical Review Letters, vol. 104, 177004, Jan. 2010, pp. 1-5.

S.H.W van der Ploeg, et al., "Controllable Coupling of Superconducting Flux Qubits," Physical Review Letters 98, 057004, 2007, pp. 1-4.

S.J. Srinivasan, et al., "Tunable Coupling in Circuit Quantum Electrodynamics Using a Superconducting Charge Qubit with a V-Shaped Energy Level Diagram," Physical Review Letters, vol. 106, 083601, Feb. 2011, pp. 1-4.

S.J. Srinivasan, et al., "Tunable Coupling in Circuit Quantum electrodynamics with a superconducting V-system," Physical Review Letters, vol. 106, 08361, 2011, pp. 1-5.

T. Hime, et al., "Solid-State Qubits with Current-Controlled Coupling," Science, vol. 314, Dec. 1, 2006, pp. 1427-1429.

\* cited by examiner

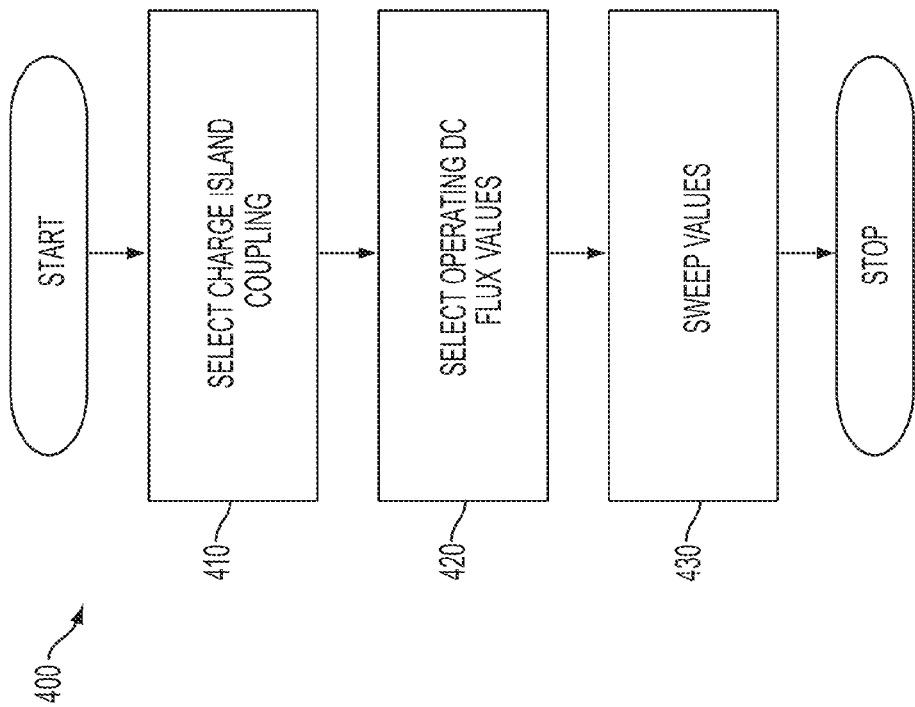
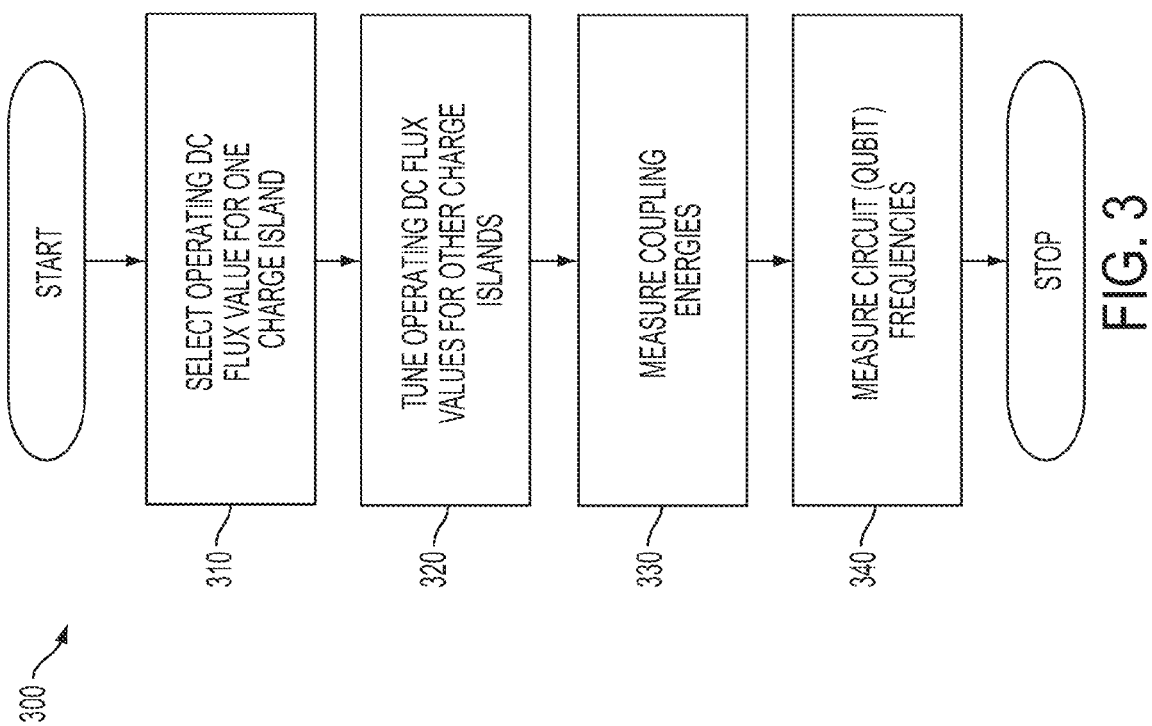

MULTI-TUNABLE SUPERCONDUCTING CIRCUITS

CROSS-REFERENCE TO RELATED APPLICATION

This application is a continuation of U.S. patent application Ser. No. 13/561,324, filed Jul. 30, 2012, the disclosure of which is incorporated by reference herein in its entirety.

FEDERAL RESEARCH STATEMENT

This invention was made with Government support under Contract No.: W911NF-10-1-0324 awarded by the U.S. Army. The Government has certain rights in this invention.

BACKGROUND

The present invention relates to superconducting circuits, and more specifically, to multi-tunable superconducting circuit system.

Superconducting circuits have experienced notable advances over the last few decades, finding numerous applications in nanotechnology. From extremely sensitive magnetometers to microwave amplifiers, photon detectors or qubits for quantum information processing, these devices offer an enormous versatility. For quantum computation, in particular, superconducting qubits in the circuit Quantum Electrodynamics (QED) architecture have proven very successful. In this architecture, one or more qubits are coupled to one or more resonators, which can act both as mediators of the coupling between the qubits and as readout elements. For systems with only a few qubits and resonators, the interaction between them does not need much tunability. As the size of the system grows, however, the ability to independently tune the coupling strength between different parts of the device becomes critical for the implementation of quantum algorithms.

Several coupling schemes between two superconducting qubits and between one superconducting qubit and one resonator have been implemented over the years. However, no solution has been given to the problem of coupling one qubit to two resonators with independent tunability of the coupling to each of the resonators. Most tunable coupling schemes in superconducting circuits realized to date have been designed to tune the coupling between qubits. In these implementations, the coupling between the qubits has mainly been achieved by non-linear inductances and most of the designs give the ability to control both the magnitude and the sign of the coupling.

Several solutions exist to couple qubits and resonators. One example is an RF SQUID in the non-hysteretic regime to couple a lumped element resonator to a phase qubit. Another example is a modified transmon with an extra degree of freedom in order to tune the dielectric dipole coupling between the qubit and the resonator. The absence of additional coupling elements significantly simplifies the circuitry. No solution has been given so far to the problem of achieving independent and tunable coupling between a quantum system and two resonators.

SUMMARY

Exemplary embodiments include a method of characterizing a tunable superconducting circuit, the method including selecting an operating direct current (DC) flux for a first charge island from a plurality of coupled charge islands residing in the tunable superconducting circuit coupled to a first resonator and a second resonator, tuning operating DC flux values for at least two charge islands from the plurality of coupled charge islands, measuring coupling energies of the first resonator and the second resonator and measuring frequencies from each of the plurality of coupled charge islands.

Additional exemplary embodiments include a method of operating a tunable superconducting circuit, the method including selecting a first charge island from a plurality of coupled charge islands residing in the tunable superconducting circuit to couple to at least one of a first resonator and a second resonator, selecting an operating direct current (DC) flux value for coupling to the at least one of the first resonator and the second resonator and measuring energy values of each of the plurality of coupled charge islands.

Further exemplary embodiments include a method, including characterizing a tunable superconducting circuit to determine working frequencies for the tunable superconducting circuit and operating the tunable superconducting circuit to determine resonant frequencies of the tunable superconducting circuit from the working frequencies, in order to tune the resonant frequencies.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 3 illustrates a flowchart for a method for characterizing a multi-tunable circuit in accordance with exemplary embodiments;

FIG. 4 illustrates a flowchart for a method for operating a multi-tunable circuit in accordance with exemplary embodiments;

DETAILED DESCRIPTION

Figure 1:
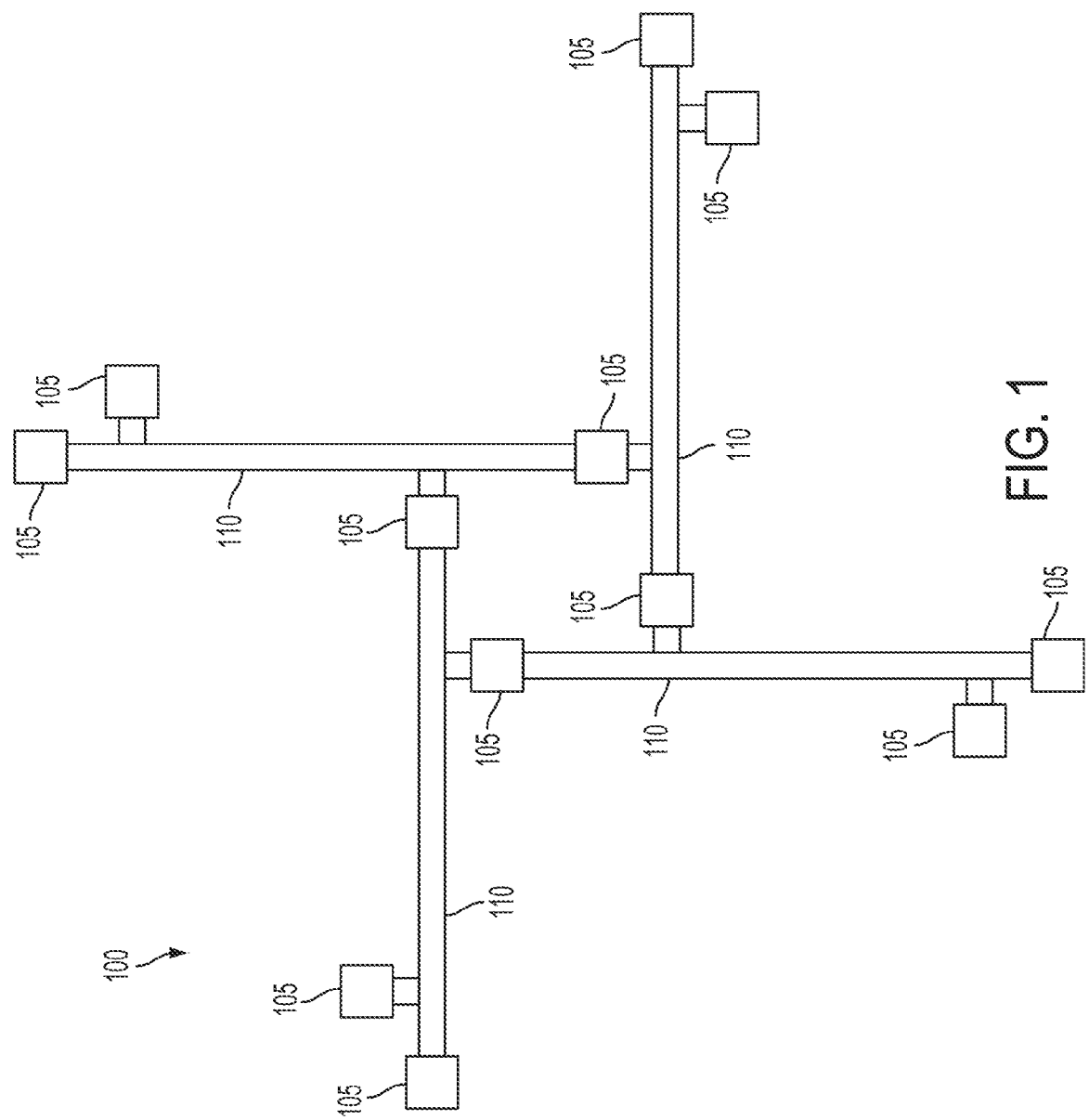
FIG. 1 illustrates an exemplary tunable superconducting circuit system.

FIG. 1 illustrates an exemplary tunable superconducting circuit system 100. The system includes multiple (superconducting) circuits 105 interconnected by multiple (superconducting) resonators 110, which allows multi-tunable circuits within the system as further described herein. In exemplary embodiments, the system 100 can be implemented in a robust, scalable quantum computer. The system 100 includes a non-linear quantum degree of freedom, which independently couples to two separate resonators 110 via an intervening circuit 105, with coupling strengths that are actively tunable.

Many conventional superconducting architectures for quantum computing are based on a quantum bus mediating long-range interactions between the quantum bits. In exemplary embodiments, the system 100 allows a tunable interaction between the resonators 110 (e.g., as buses). The tunable interaction allows for large-scale quantum information processing, as unwanted long-range interactions are detrimental to making a fault-tolerant quantum computer. Other tunable couplers have been built but they lack independent coupling to more than one bus.

In exemplary embodiments, there are multiple functionalities of each of the underlying circuits 105. For example, each of the circuits 105 can be implemented as a qubit, which can be part of a larger network of qubits coupled to the resonators 110, as shown in FIG. 1. As a qubit, each of the circuits 105 can be actively coupled to either of two resonators 110, both, or neither. In addition, the coupling strengths are fully independently tunable, and the circuits 105 can be used directly as a tunable coupling element between two resonators 110. In exemplary embodiments, the qubit state can either be protected or re-initialized by turning on the coupling to a high or low quality factor resonator, respectively. Furthermore, each of the circuits 105 can be used to couple separate qubits, which are each independently coupled to resonators 110 that are otherwise decoupled from one another. The system 100 can be implemented in numerous larger-scale superconducting quantum computing implementations, especially as a functional element for connecting modularized components comprising a few circuits 105 (qubits) and resonators 110.

Figure 2:
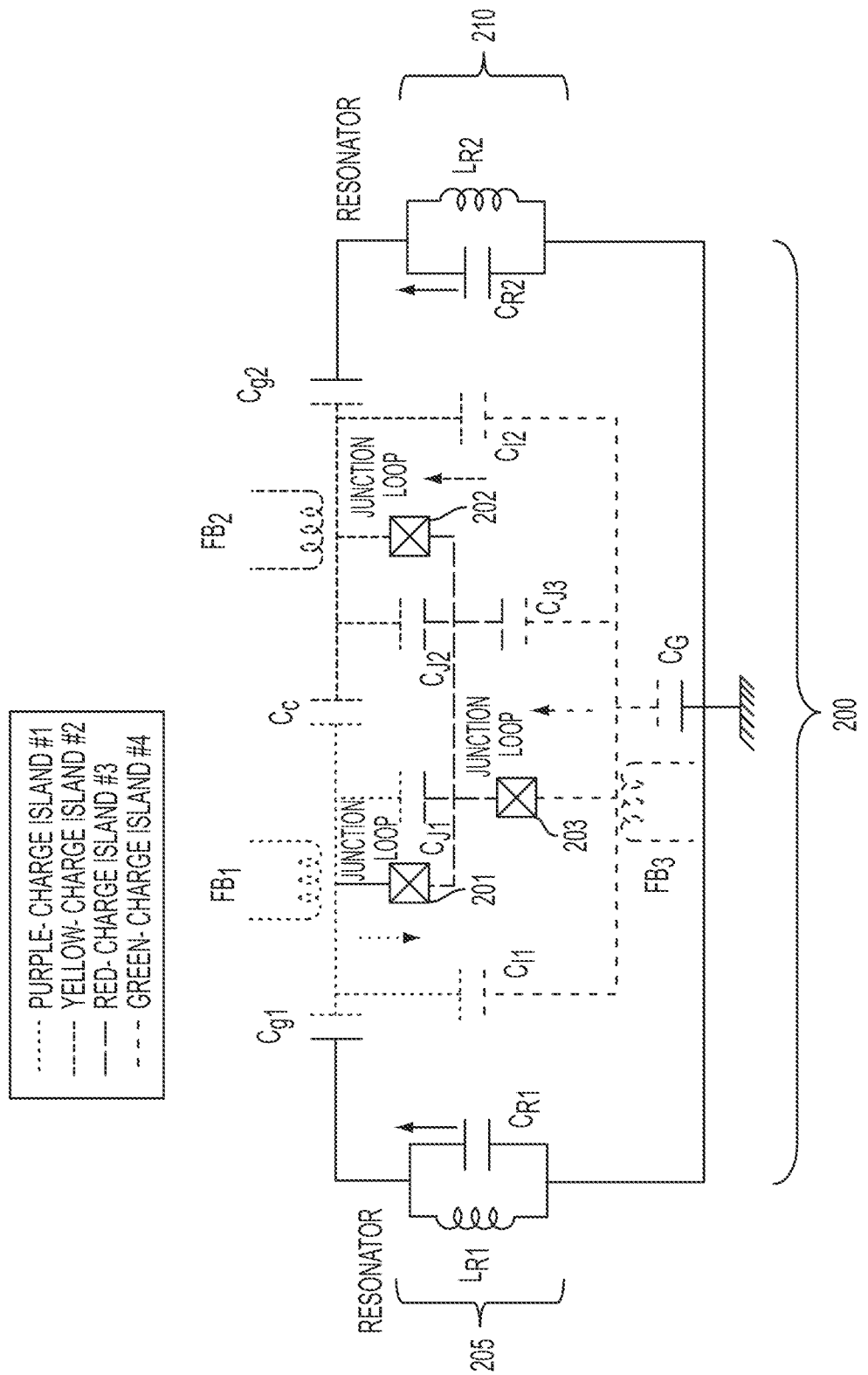
FIG. 2 illustrates an exemplary superconducting circuit and exemplary resonators.

FIG. 2 illustrates an exemplary superconducting circuit 200 (e.g., circuits 105 of FIG. 1) and two adjacent resonators 205, 210 (e.g., resonators 110 of FIG. 1), which are configured as harmonic oscillators. As described herein, the system 100 of FIG. 1 enables multi-tunable circuits within the system 100. In the example of FIG. 2, the circuit 200 is a double tunable circuit as now described. In exemplary embodiments, the circuit 200 includes three Josephson junction loops 201, 202, 203, respectively shunted by capacitors $C_{J1}$, $C_{J2}$, $C_{J3}$, connected in parallel to the three Josephson junction loops 201, 202, 203. Each of the Josephson junction loops 201, 202, 203 is respectively coupled to a flux bias line $F_{B1}$, $F_{B2}$, $F_{B3}$ configured to provide a magnetic flux for tuning the circuit 200. In exemplary embodiments, the three capacitively shunted Josephson junction loops 201, 202, 203 define four charge islands (as defined by the legend in FIG. 2). Each of the four charge islands is capacitively coupled to the other three islands. As such, charge island #1 is coupled to charge island #2 via capacitor $C_C$. Charge island #1 is coupled to charge island #3 via capacitor $C_{J1}$. Charge island #1 is coupled to charge island #4 via capacitor $C_{J1}$. Charge island #2 is coupled to charge island #3 via capacitor $C_{J2}$. Charge island #2 is coupled to charge island #4 via capacitor $C_{J2}$. Charge island #3 is coupled to charge island #4 via capacitor $C_{J3}$. In addition, Charge island #4 is coupled to ground via capacitor $C_G$. In exemplary embodiments, the four charge islands are configured to operate as a superconducting qubit. Furthermore, charge island #1 is capacitively coupled to the resonator 205 via capacitor Cg1, and charge island #2 is capacitively coupled to the resonator 210 via capacitor Cg2. In the example of FIG. 2, the resonator 205 includes an inductor $L_{R1}$ coupled in parallel with a capacitor $C_{R1}$, and the resonator 210 includes an inductor $L_{R2}$ coupled in parallel with a capacitor $C_{R2}$.

In exemplary embodiments, the example of FIG. 2 provides six Josephson junctions arranged in three two junction loops among the four charge islands. As described herein, charge island #1 is capacitively coupled to the resonator 205, and charge island #2 is capacitively coupled to the resonator 210. In exemplary embodiments, tuning the magnetic flux through each of the three loops 201, 202, 203 respectively through the flux bias lines $F_{B1}$, $F_{B2}$, $F_{B3}$ allows for control of the coupling energy between each resonator 205, 210 and the superconducting circuit 200 independently. The circuit 200 can be tuned to maintain a constant resonant frequency while varying the coupling to the resonators 205, 210, thereby coupling nearby circuits in the system 100.

In exemplary embodiments, coupling among the four-island qubit and each resonator 205, 210 can be tuned by changing the energies of the islands relative to each other. Therefore, the operation of the circuit 200 includes independently tuning the energy of each island. In exemplary embodiments, tuning can be implemented by driving a direct current (DC) current through the flux bias lines $F_{B1}$, $F_{B2}$, $F_B$. The DC current originates a magnetic flux that biases the junction energy according to the formula:

$$E_J = I_0 * \phi_0 / 2\pi * \cos(2\pi \phi / \phi_0) \qquad \text{EQ. 1}$$

where $I_0$ is the total critical current of the junction loop, $\phi$ is the magnetic flux threading the loop and $\phi_0$ is the flux quantum. The other relevant energy in play is the electron charging energy $E_C = 4 e^2 / 2 C$, where e is the electron charge and C is the renormalized capacitance of the junction loop. These energies define the resonance frequency of each of the Josephson junction loops 201, 202, 203. A ground and first excited states of each junction loop are spaced by an energy approximately equal to $E_q = (8 E_J E_C)^{1/2}$ Operation of the circuit is now described. FIG. 3 illustrates a flowchart for a method 300 for characterizing a multi-tunable circuit in accordance with exemplary embodiments. At block 310, the user selects an operating DC flux value for one of the charge islands. For illustrative purposes, the user selected an operating $F_{B3}$ DC flux value. It will be appreciated that the other flux bias lines $F_{B1}$, $F_{B2}$ can be selected as well. The operating $F_{B3}$ DC flux value corresponds to an energy for the Josephson junction loop 3, 203 which determines the "qubit" working frequency $f_Q$. The operating $F_{B3}$ DC flux value is referred to as $F_{B3}0$.

At block 320, the user tunes the operating DC flux values for two other charge islands. In the example, the user tunes flux bias lines $F_{B1}$, $F_{B2}$ over a flux quantum with the other flux bias line ($F_{B2}$ or $F_{B1}$) fixed at an arbitrary value and flux bias line $F_{B3}$ at $F_{B3}0$.

At block 330, the user measures coupling energies between the circuit 200 and each of the resonators 205, 210. For each flux bias lines $F_{B1}$, $F_{B2}$ line value, the user measures the coupling energies $g_1$, $g_2$, respectively between the circuit 200 (i.e., the qubit) and resonators 205, 210, as described further herein. The respective values for the value for the flux bias line $F_{B1}$, $F_{B2}$ for which the coupling energies $g_1$, $g_2$ are at their relative maximum values are $F_{B1}^M$, $F_{B2}^M$, and the respective values for the value for the flux bias line $F_{B1}$, $F_{B2}$ for which the coupling energies $g_1$, $g_2$ are at their relative minimum values are $F_{B1}^m$, $F_{B2}^m$.

At block 340, the qubit frequencies are measured. Several different measurements are made. First, the flux bias line $F_{B1}$ is held at $F_{B1}^m$, while the flux bias line $F_{B2}$ is held at an arbitrary value and $F_{B3}$ is held at $F_{B3}^0$. The user measures the "qubit" frequency, which is given by the energy of junction loop 203, and calls this frequency $f_{Q1}$. The flux bias line $F_{B3}$ is tuned until $f_{Q1} = f_Q$. The value of $F_{B3}$ for which $f_{Q1} = f_Q$ is called $F_{B3}^1$. Then, the flux bias line $F_{B2}$ is held at $F_{B2}^m$, while the flux bias line $F_{B1}$ is held at an arbitrary value and $F_{B3}$ is held at $F_{B3}^0$. The user measures the "qubit" frequency, which is given by the energy of junction loop 203, and calls this frequency $f_{Q2}$. The flux bias line $F_{B3}$ is tuned until $f_{Q2} = f_Q$.

The value of $F_{B3}$ for which $f_{Q2}=f_Q$ is called $F_{B3}{}^2$. Finally, the flux bias line $F_{B1}$ is held at $F_{B1}{}^m$, while the flux bias line $F_{B2}$ is held at $F_{B2}{}^m$ and $F_{B3}$ is held at $F_{B3}{}^0$. The user measures the "qubit" frequency, which is given by the energy of junction loop 203, and calls this frequency $f_{Q12}$. The flux bias line $F_{B3}$ is tuned until $f_{Q12}=f_Q$. The value of $F_{B3}$ for which $f_{Q12}=f_Q$ is called $F_{B3}{}^{12}$.

FIG. 4 illustrates a flowchart for a method 400 for operating a multi-tunable circuit in accordance with exemplary embodiments. At block 410, the charge island(s) for coupling to one or more of the resonators are selected. There are several possibilities for selecting the charge islands. The circuit 200 can be coupled to both resonators 205, 210. The circuit 200 can be coupled to only resonator 205. The circuit 200 can be coupled to only resonator 210. The circuit 500 can be operated uncoupled from both the resonators 205, 210. At block 420, the operating DC flux values are selected. There are several possibilities for selecting the operating DC flux values. When the circuit 200 is coupled to both resonators 205, 210, the user sets $F_{B1}=F_{B1}{}^M$, $F_{B2}=F_{B2}{}^M$, and $F_{B3}=F_{B3}{}^0$. When the circuit 200 is coupled to only resonator 205, the user sets $F_{B1}=F_{B1}{}^M$, $F_{B2}=F_{B2}{}^m$ and FB3=FB3². When the circuit 200 is coupled to only resonator 210, the user sets $F_{B1}=F_{B1}{}^m$, $F_{B2}=F_{B2}{}^M$ and $F_{B3}=F_{B3}{}^1$. When the circuit 500 can be operated uncoupled from both the resonators 205, 210, the user sets $F_{B1}=F_{B1}{}^m$, $F_{B2}=F_{B2}{}^m$ and $F_{B3}=F_{B3}{}^{12}$.

At block 430, with the values of energies $E_{J3}$, $E_{C3}$ held at a constant value, say $E_{J3}/E_{C3}=75$, the values of energies $E_{J1}$, $E_{J2}$ are independently swept by driving DC currents through flux bias lines $F_{B1}$, $F_{B2}$, respectively. For each value of the energies $E_{J1}$, $E_{J2}$, the coupling of the circuit 200 to each resonator 205, 210 can be measured by applying a microwave frequency pulse on the flux bias line $F_{B3}$ at the frequency associated with an energy $E_{q3}$, of the circuit 200, with the right power and duration so that the Josephson Junction loop 203 ends in the first excited state and then measuring the resonance frequency shift of each resonator 205, 210. The measured resonance frequency shift is proportional to the square of the coupling energy g to the circuit 200.

Figure 5:
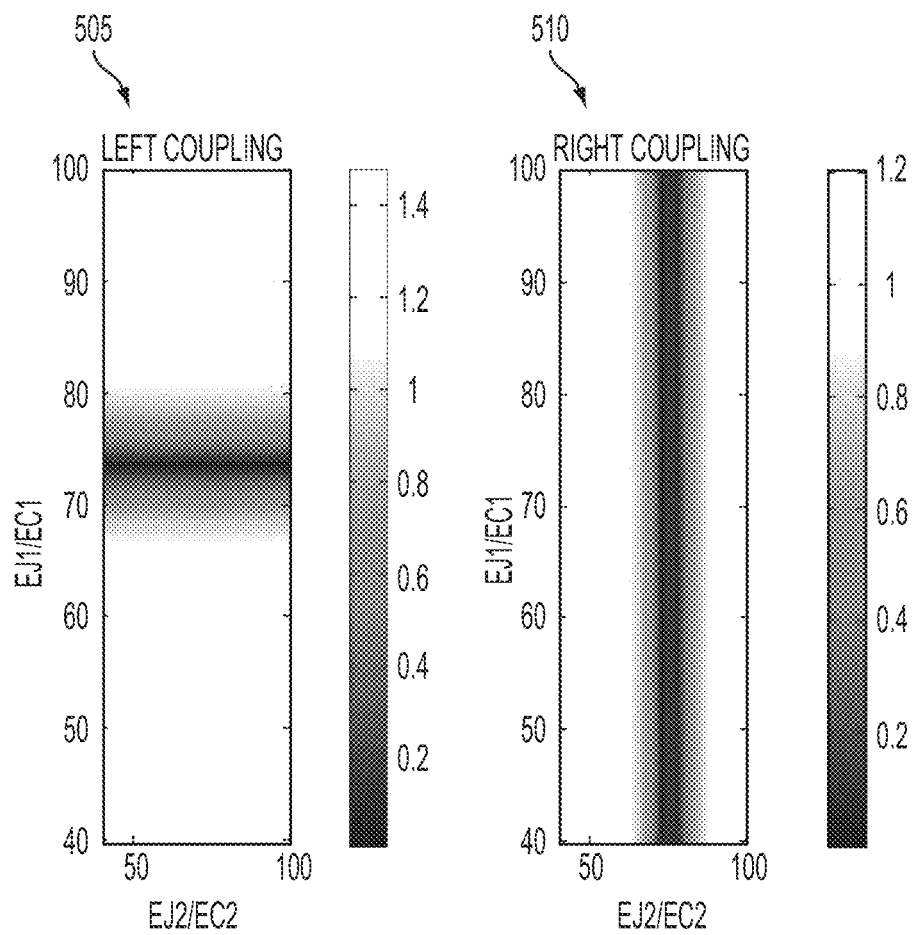
FIG. 5 illustrates two plots of energy ratios that illustrate a quantity proportional to a coupling energy in arbitrary units as calculated from numerical simulations.

FIG. 5 illustrates plots 505, 510 showing a magnitude (in arbitrary units) of the coupling of the exemplary superconducting circuit 200 and the adjacent resonators 205, 210 as a function of the energies in two Josephson junction loops 201, 202 while the energy in another Josephson junction loop 203 is kept constant. The minimum coupling energies are much lower than any other energy relevant to the system 100. As such, at the relative minimum coupling energies described herein, the circuit 200 can be considered completely decoupled from either resonator.

In exemplary embodiments, the energy at which the circuit operates as a qubit, at energy Eq3, changes slightly near the regions of minimum coupling to each resonator 205, 210 due to interactions with the other two Josephson junction loops 201, 202. Therefore, in order to operate the device as a qubit, a correcting DC flux needs to be applied through flux bias line $F_{B3}$ to keep the energy Eq3 constant.

Figure 6:
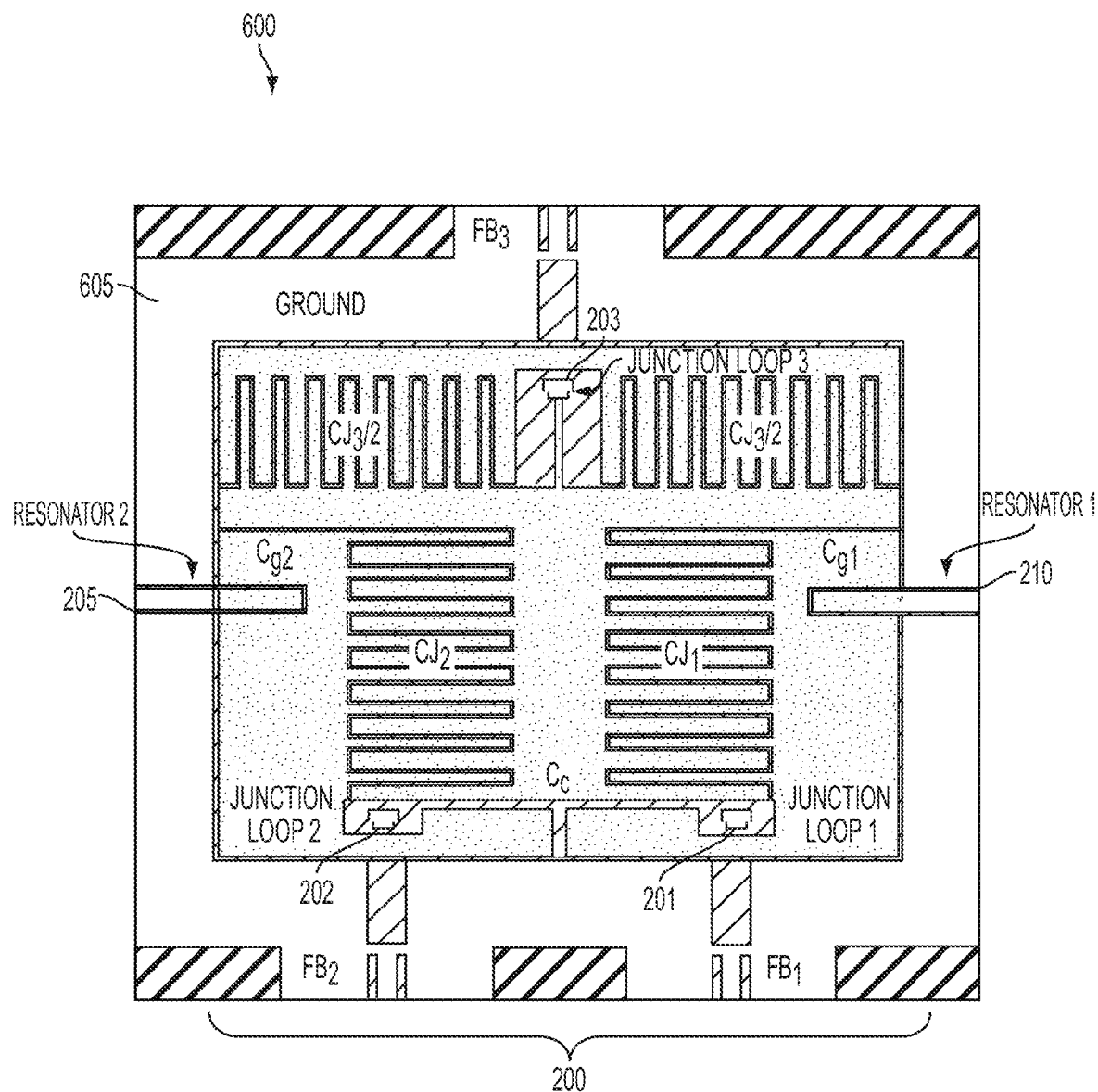
FIG. 6 illustrates a schematic layout of an embodiment of a multi-tunable circuit.

FIG. 6 illustrates a schematic layout of an embodiment of a multi-tunable circuit 200 as shown herein. In the example, the three Josephson junction loops 201, 202, 203 and respective capacitors are arranged within a pocket of dimensions 400×300 microns. The Josephson junction loops 201, 202, 203 have an area of 15×15 micron squared. The flux bias lines $F_{B1}$, $F_{B2}$, $F_{B3}$ are shorted in order to drive a DC current through them. The resonators 205, 210, flux bias lines $F_{B1}$, $F_{B2}$, $F_{B3}$, capacitors and junctions are made of a superconducting material. In the example, the resonators 205, 210, the ground plane 605 and the bias lines $F_{B1}$, $F_{B2}$, $F_{B3}$ are made out of niobium, whereas the capacitors and the Josephson junctions are made out of aluminum. The superconducting material is deposited on top of a chip that can be Silicon, sapphire or other suitable dielectric.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of characterizing a tunable superconducting circuit, the method comprising:
    selecting an operating direct current (DC) flux for a first charge island from a plurality of coupled charge islands residing in the tunable superconducting circuit coupled to a first resonator and a second resonator;
    tuning operating DC flux values for at least two charge islands from the plurality of coupled charge islands;
    measuring coupling energies of the first resonator and the second resonator; and
    measuring frequencies from each of the plurality of coupled charge islands.

2. The method as claimed in claim 1 wherein each of the plurality of coupled charge islands includes a junction loop coupled to a subset of the plurality of coupled charge islands.

3. The method as claimed in claim 2 wherein the junction loops are tuned in frequency to operate together as a qubit.

4. The method as claimed in claim 2 wherein each of the plurality of coupled charge islands is coupled to one of a plurality of flux bias lines.

5. The method as claimed in claim 4 further comprising:
generating fluxes from each of the plurality of flux bias lines to tune a respective junction loop.

6. The method as claimed in claim 5 wherein each flux corresponds to an energy for each junction loop that determines a working frequency.

7. The method as claimed in claim 6 further comprising adjusting each of the fluxes until the working frequency for each of the plurality of coupled charge islands are equal.

8. A method of operating a tunable superconducting circuit, the method comprising:
selecting a first charge island from a plurality of coupled charge islands residing in the tunable superconducting circuit to couple to at least one of a first resonator and a second resonator;
selecting an operating direct current (DC) flux value for coupling to the at least one of the first resonator and the second resonator; and
measuring energy values of each of the plurality of coupled charge islands.

9. The method as claimed in claim 8 wherein the first charge island is coupled to at least one of the first and second resonators.

10. The method as claimed in claim 8 wherein the first charge island is coupled to the first and second resonators.

11. The method as claimed in claim 8 wherein the first charge island is uncoupled from the first and second resonators.

12. The method as claimed in claim 8 wherein each of the plurality of coupled charge islands includes a junction loop coupled to a subset of the plurality of coupled charge islands.

13. The method as claimed in claim 12 wherein the junction loops are tuned in frequency to operate together as a qubit.

14. The method as claimed in claim 12 wherein each of the plurality of coupled charge islands is coupled to one of a plurality of flux bias lines.

15. The method as claimed in claim 14 further comprising:
generating fluxes from each of the plurality of flux bias lines to tune a respective junction loop.

16. The method as claimed in claim 15 wherein each flux corresponds to an energy for each junction loop that determines a working frequency.

17. The method as claimed in claim 16 further comprising adjusting each of the fluxes until the working frequency for each of the plurality of coupled charge islands are equal.

18. The method as claimed in claim 14 further comprising:
sweeping each of the plurality of flux bias lines with a plurality of flux values; and
measuring coupling values to the first and second resonators to obtain a resonance frequency for each of the plurality of coupled charge islands.

19. A method, comprising:
characterizing a tunable superconducting circuit to determine working frequencies for the tunable superconducting circuit; and
operating the tunable superconducting circuit to determine resonant frequencies of the tunable superconducting circuit from the working frequencies, in order to tune the resonant frequencies;
wherein the tunable superconducting circuit comprises a first charge island, a second charge island, a third charge island, a fourth charge island, a first junction loop electrically coupled to the first and third charge islands, a second junction loop coupled to the second and third charge islands, and a third junction loop coupled to the third and fourth charge islands, with the first, second and third junction loops tuned in frequency to operate together as a qubit.

* * * * *